United States Patent [19]

Pliefke

[11] Patent Number: 4,549,944
[45] Date of Patent: Oct. 29, 1985

[54] ELECTROCHEMICAL DEVELOPING PROCESS FOR REPRODUCTION LAYERS

[75] Inventor: Engelbert Pliefke, Wiesbaden, Fed. Rep. of Germany

[73] Assignee: Hoechst Aktiengesellschaft, Frankfurt am Main, Fed. Rep. of Germany

[21] Appl. No.: 408,906

[22] Filed: Aug. 17, 1982

[30] Foreign Application Priority Data

Aug. 28, 1981 [DE] Fed. Rep. of Germany ....... 3134054

[51] Int. Cl.[4] ........................... C25F 3/02; C25F 5/00
[52] U.S. Cl. ............................... 204/129.1; 204/129.3; 204/129.4; 204/129.75; 204/129.95; 204/131; 430/299; 430/326
[58] Field of Search ............... 204/129.1, 129.3, 129.4, 204/129.65, 129.75, 129.43, 129.95, 131; 430/299, 949, 52, 48, 309, 310, 331, 299, 325, 326

[56] References Cited

U.S. PATENT DOCUMENTS

| | | | |
|---|---|---|---|
| 909,831 | 1/1909 | Strecker et al. | 430/52 |
| 1,579,898 | 4/1926 | Helfrich et al. | 204/129.65 |
| 1,892,099 | 12/1932 | Cornell | 204/17 |
| 2,117,294 | 5/1938 | Buchser | 204/5 |
| 2,480,845 | 9/1949 | Frager et al. | 204/141 |
| 2,541,488 | 2/1951 | Vanselow et al. | 95/6 |
| 3,149,059 | 9/1964 | Bonrud | 430/52 |
| 3,284,199 | 11/1966 | Maffet et al. | 96/50 |
| 3,944,421 | 3/1976 | Lewis et al. | 430/310 |
| 3,975,243 | 8/1976 | Levinos | 430/325 X |
| 4,023,898 | 5/1977 | Ohno et al. | 355/10 |
| 4,292,395 | 9/1981 | Wada et al. | 430/299 |
| 4,356,254 | 10/1982 | Takahashi et al. | 430/296 |

OTHER PUBLICATIONS

IBM Techniches Disclosure Bulletin, vol. 11, No. 12, May 1969, p. 1735.

*Primary Examiner*—Donald R. Valentine
*Attorney, Agent, or Firm*—Schwartz, Jeffery, Schwaab, Mack, Blumenthal & Evans

[57] ABSTRACT

In the development of exposed light-sensitive reproduction layers using an aqueous electrolyte developer the parts of the layer corresponding to the non-image areas are removed by electrochemical treatment. An electrolyte is used which has a pH in the range from 2.0 to 10.0 and contains at least one salt in a concentration of 0.1 weight percent up to the saturation limit of the solution for the particular salt. The electrolyte may also contain 0.1 to 5 weight percent surfactant.

20 Claims, No Drawings

ELECTROCHEMICAL DEVELOPING PROCESS FOR REPRODUCTION LAYERS

BACKGROUND OF THE INVENTION

The present invention relates to a developing process for reproduction layers using an aqueous electrolyte developer.

Light-sensitive reproduction layers are used, for example, in the preparation of offset printing plates or in the preparation of photoresists (both referred to hereinafter as copying materials). In general, such layers are applied to a support by the customer or industrial manufacturer. The supports used for such copying materials include metals such as zinc, magnesium, chromium, copper, brass, steel, silicon, aluminum or combinations of these metals, plastic films, paper or similar materials. These supports can be coated with the light-sensitive reproduction layer without a surface modifying pretreatment of the support, but preferably the coating step is preceded by surface modification such as mechanical, chemical and/or electrochemical roughening, surface oxidation and/or treatment with agents which impart hydrophilicity (for example in the case of supports for offset printing plates). In addition to at least one light-sensitive compound, conventional reproduction layers usually also contain an organic binder (resins or the like) and, optionally, also plasticizers, pigments, dyestuffs, wetting agents, sensitizers, adhesion promoters, indicators and other customary additives. In order to produce an image from the reproduction layers, the layers are developed after their exposure to obtain a printing plate, a photoresist, or similar article.

A developer for negative-working reproduction layers must be able to dissolve out of the exposed layer those parts of the layer (the non-image areas) which have not been struck by electromagnetic radiation (for example light), without significantly affecting those parts (the image areas) of the layer which have been struck by the radiation. U.S. Pat. No. 3,867,147 lists as examples of suitable developers: water, water/organic solvent mixtures, aqueous salt solutions, aqueous acid solutions, aqueous alkaline solutions and undiluted organic solvents to which, if appropriate, surfactants and/or agents imparting hydrophilicity can be added. The developers chiefly used in the examples of the aforementioned patent contain water, sodium lauryl-sulfate, sodium sulfate, tartaric acid and, optionally, benzyl alcohol. Other developers contain isopropanol, n-propanol, n-propyl acetate, polyacrylic acid, 1,1,1-trichloroethane, acetone or ethylene glycol monomethyl ether.

A developer for positive-working reproduction layers must be able to dissolve out of the exposed layer those parts of the layer (the non-image areas) which have been struck by electromagnetic radiation, without significantly affecting those parts of the layer (the image areas) which have not been struck by the radiation. U.S. Pat. No. 3,110,596 lists as examples of suitable developers alkaline aqueous solutions of phosphates, silicates, fluorosilicates, stannates, fluoroborates or fluorotitanates, which optionally may also contain water-soluble hydrocolloids or organic solvents.

A "developer" or "decoating agent" for electrophotographic reproduction layers must be able to dissolve out of the layer the non-image areas remaining after (a) charging of the reproduction layer containing a photoconductor, (b) exposure of the charged layer and (c) application of toner and fixing of the resulting latent electrostatic image, without significantly affecting the image areas of the layer. German Pat. No. 1,117,391 lists as examples of liquids suitable for this purpose: inorganic or organic bases in aqueous solutions to which organic solvents can also be added. Specific examples include octylamine in polyethylene glycol, morpholine, sodium silicate and carboxymethylcellulose in water monoethanolamine, diethanolamine, methanol, ethylene glycol, glycerol and sodium silicate; aqueous NaOH solution; and aqueous $NH_3$ solution with polyethylene glycol.

The developing processes known in the prior art for exposed reproduction layers work on the principle of a differentiation in solubility between exposed and non-exposed areas and parts of the layer. The pH values of suitable developers therefore frequently differ from neutral, and they contain more or less large amounts of organic solvents. The content of active ingredients in known developers, in addition to water as the desired standard solvent, are in general above about 5 to 10 percent by weight, so that the developers represent an increasingly undesirable effluent burden. Moreover, in practice, developers having a specific action are marketed for most of the wide variety of reproduction layers available and such developers are not suitable for developing other reproduction layers. Typical developing times in the known processes are between 15 and 120 seconds.

SUMMARY OF THE INVENTION

Accordingly it is the object of the present invention to provide an improved developing process for reproduction layers.

Another object of the present invention is to provide a developing process for reproduction layers which utilizes aqueous developing liquids.

A further object of the present invention is to provide a developing process for reproduction layers which can be used with a wide variety of reproduction layers including negative-acting layers, positive-acting layers and/or electrophotographic reproduction layers.

It is also an object of the present invention to provide a developing process for reproduction layers which avoids the use of organic solvents.

An additional object of the present invention is to provide a developing process for reproduction layers which does not need to use large amounts of additives.

Yet another object of the present invention is to provide a developing process for reproduction layers which will reduce the waste treatment burden in order to avoid environmental pollution.

A still further object of the present invention is to provide a developing process for reproduction layers which can be used to develop offset printing plates, photoresists, and the like.

These and other objects of the invention are achieved by providing a process for developing exposed light-sensitive reproduction layers using an aqueous electrolyte developer, said process comprising removing by electrochemical treatment those parts of the exposed layer which correspond to the non-image areas.

DETAILED DESCRIPTION OF PREFERRED EMBODIMENTS

The invention starts from the known processes for developing exposed light-sensitive reproduction layers using an aqueous electrolyte developer. The process of the invention comprises removing by electrochemical treatment those parts of the layer which correspond to the non-image areas. The aqueous electrolyte may have a pH value in the range from 1 to 14, in particular from 2.0 to 10.0. In addition to the main constituent water, the aqueous electrolyte contains a dissociated compound, particularly at least one salt of an organic or inorganic acid in a concentration from 0.1 percent by weight up to the saturation limit of the solution of the particular salt. These salt solutions may also be in the form of a buffer system and then also contain, in addition to the salt content, weak acids (such as acetic acid) or weak bases (such as ammonia). It may also be advantageous to shift the pH value of the salt solutions by adding acids or bases, but the pH should not exceed or be less than the values indicated above. Instead of the preferred salts, the aqueous electrolyte may also contain as dissociated compound, acids (such as acetic acid or boric acid) within the pH value range indicated.

Salts which can be used in the aqueous electrolyte in the process according to the invention include in particular those which contain as cations $Li^+$, $Na^+$, $K^+$, $NH_4^+$, $Al^{3+}$, $Fe^{2+}$, $Fe^{3+}$, $V^{5+}$, $Ca^{2+}$, $Mg^{2+}$, $Sr^{2+}$, or $Ba^{2+}$ and as anions $SO_4^{2-}$, $S_2O_3^{2-}$, $SCN^-$, $CO_3^{2-}$, $CH_3COO^-$, $NO_3^-$, $NO_2^-$, $PO_4^{3-}$, $BO_2^-$, polyphosphates, polyborates, $F^-$, $Cl^-$, $Br^-$, $BF_4$, $N_3^-$ $VO_3^-$, anions of alkyl-sulfates (sulfuric acid monoalkyl ester anions) with alkyl groups from $C_7$ to $C_{16}$ or their corresponding hydrogen salts.

To promote uniformity and accelerate the process according to the invention, the aqueous electrolyte may also contain a surfactant which is different from the dissociated compounds listed above and is preferably added in a concentration of 0.1 to 5 percent by weight. Not only non-ionic but also anionic or cationic surfactants can be used; however, they should preferably be of the low-foaming type, particularly when the process of the invention is carried out in processing machines. Examples of surfactants which have been found to be suitable include alkali metal salts or ammonium salts of sulfuric acid monoalkyl esters having $C_7$ to $C_{16}$ alkyl groups, ethoxylated alcohols and phenols, ethoxylated fatty amines and alkylene oxide block polymers.

The process of the invention thus makes it possible to differentiate imagewise the most diverse types of exposed light-sensitive reproduction layers in aqueous solutions which do not contain an organic solvent or other relatively large amounts of polluting additives. The degree of resolution obtainable in this process corresponds to that of conventional developers used non-electrochemically, and the developing time, depending on the current density and the nature and concentration of the electrolyte, is generally about 0.5 to 30 seconds. The principle of action of the process according to the invention is probably based on the different permeability to ions and/or solubility of exposed and non-exposed areas and parts of the reproduction layers. The type of support used for the reproduction layers essentially influences only the developing rate but, provided a suitable electrolyte is used, does not affect the final results of the developing process.

Since the pH value of a non-buffered aqueous electrolyte can change while the process according to the invention is being carried out, due to chemical or electrochemical changes in its components, the use of an additional buffer system is advisable when the aqueous electrolyte is to be used several times.

The concentration of the dissociated compound in the aqueous electrolyte may range from 0.1 percent by weight, in particular 1 percent by weight, to the particular saturation concentration of the dissociated compound. Concentrations of up to 5 percent by weight are generally sufficient. If the concentration of the aqueous electrolyte is below 0.1 percent by weight, then the conductivity of the solution is usually too low, so that the resulting current density becomes too low to obtain rapid development. The temperature of the aqueous electrolyte may range from room temperature up to the boiling point of the electrolyte system, but a temperature of 20° to 70° C. is preferably maintained. Agitation or stirring of the aqueous electrolyte while the process of the invention is being carried out is generally not necessary.

The process according to the invention can be carried out using direct current or alternating current of various frequencies and types of modulation, but it is also possible to use pulsed direct current. In the process, the current density can in principle also be outside a range of 1 to 100 $A/dm^2$, but this range is preferable, since otherwise the aqueous electrolyte is heated up to too great an extent and/or the duration or quality of the developing process can be adversely affected. The current density increases at the start of electrolyte development, remains for a certain time at one level and increases again slightly toward the end of the developing process.

As a rule, hydrogen is evolved at the cathode during the electrochemical developing process by discharge of $H^+$ ($H_3O^+$) ions. It is assumed that this strongly increases the local pH value and can effect the stripping of the more soluble part of the imagewise-exposed reproduction layer. The high pH value which occasionally arises in this step can in some aqueous electrolytes lead to the support of the reproduction layer being attacked in places; however, the actual developing process is not influenced thereby, and this attack can be reduced, should this be at all necessary, by the addition of corrosion inhibitors. Inadequate wetting of the reproduction layers by the aqueous electrolyte can occasionally lead to the occurrence of residues of the layer in image-free areas, but this can be avoided by the use of a surfactant suitable for the layer concerned or by brief "soaking" of the plate in the aqueous electrolyte before the actual electrochemical developing step.

In a preferred embodiment of the process of the invention, the reproduction layer to be treated, which is usually present as part of a copying material having an electrically conductive support, is contacted with the aqueous electrolyte solution by dipping. In this step, one edge of the support material should project above the surface of the electrolyte bath so that a supply of current can be connected to this part. Another way of supplying current is to establish the contact via the uncoated backside of the support material. The counter-electrode should be comprised of a material which is resistant to the aqueous electrolyte, for example stainless steel or graphite, and should preferably have the shape of a rod, of a sieve or of a plate and be mounted in particular at a uniform distance from the copying material, so that a uniform current density is present over the entire surface of the imagewise-exposed copying material. The uncoated backside of the copying material to be developed should preferably be adjacent to a non-conductive material, in order to avoid unnecessary consumption of electrical energy. Another possibility is to seal off the backside of the material, the plate being guided in the electrolyte bath vessel in tight grooves.

In another embodiment of the process according to the invention, a cloth is used which is impregnated with aqueous electrolyte and arranged between the exposed copying material and the counter-electrode. After the developing step, the cloth can be discarded without causing major pollution, since the pH value of the electrolyte is as a rule near the neutral point or can be so adjusted.

In particular, the reproduction layer to be developed may be a light-sensitive layer on an offset printing plate or a suitable photoresist layer applied to a support material. Suitable support materials are desirably electrically conductive and include, for example, supports formed of zinc, chromium, magnesium, copper, brass, steel, silicon, aluminum or combinations of these metals. These support materials may be provided with a suitable reproduction layer without any special modifying pretreatment, but coating is preferably carried out only after a surface modification treatment such as mechanical, chemical or electrochemical roughening, oxidation and/or treatment with agents imparting hydrophilicity. Surface modifying pretreatment is particularly desirable for supports for offset printing plates.

Particularly suitable substrates for preparation of offset printing plates include substrates made of aluminum or of an aluminum alloy. They include, for example:

pure aluminum according to German Industrial Standard DIN Material No. 3.0255 comprising 99.5 percent of Al and the following permissible impurities (maximum total amount 0.5 percent) 0.3 percent of Si, 0.4 percent of Fe, 0.03 percent of Ti, 0.02 percent of Cu, 0.07 percent of Zn and 0.03 percent of others, or aluminum alloy 3003 comparable to the material defined by DIN Material No. 3.0515 comprising 98.5 percent of Al, the alloy constituents: 0 to 0.3 percent of Mg and 0.8 to 1.5 percent of Mn, and the following permissible impurities: 0.5 percent of Si, 0.5 percent of Fe, 0.2 percent Of Ti, 0.2 percent of Zn, 0.1 percent of Cu and 0.15 percent other.

Aluminum support materials for printing plates, which are very common in practice, are generally roughened before application of the light-sensitive layer. Roughening may be effected mechanically (for example by brushing and/or by treatment with abrasive materials), chemically (for example by means of etching agents) or electrochemically (for example by treatment with alternating current in aqueous HCl or $HNO_3$ solutions). Electrochemical roughening is preferred. The mean roughness $R_z$ of the roughened surface is desirably in the range from about 1 to 15 $\mu$m, particularly from 4 to 8 $\mu$m.

The roughness is determined according to DIN 4768 as amended in October 1970, with the roughness $R_z$ then being the arithmetic mean of the individual roughness values of five contiguous individual measurement zones.

The electrochemical roughening may optionally be followed by anodic oxidation of the aluminum in a further process stage, for example to improve the abrasion resistance and the adhesive properties of the surface of the support material. Customary electrolytes such as $H_2SO_4$, $H_3PO_4$, $H_2C_2O_4$, amidosulfonic acid, sulfosuccinic acid, sulfosalicylic acid or mixtures thereof may be used for the anodic oxidation. Examples of standard methods of using aqueous $H_2SO_4$-containing electrolytes for the anodic oxidation of aluminum include (see, for example, M. Schenk, Werkstoff Aluminium and seine anodische Oxydation [Aluminum Material and its Anodic Oxidation], Francke Verlag—Bern, 1948, page 760; Praktische Galvanotechnik [Practical Electrotechnology], Eugen G. Leuze Verlag—Saulgau, 1970, pages 395 et seq. and pages 518/519; W. Hübner and C. T. Speiser, Die Praxis der anodischen Oxydation des Aluminiums [Anodic Oxidation of Aluminum in Practice], Aluminium Verlag—Düsseldorf, 1977, 3rd Edition, pages 137 et seq.):

The direct current/sulfuric acid process, in which the anodic oxidation is carried out for 10 to 60 minutes at 10° C. to 22° C. and a current density of 0.5 to 2.5 $A/dm^2$ in an aqueous electrolyte usually comprising about 230 g of $H_2SO_4$ per liter of solution. The concentration of sulfuric acid in the aqueous electrolyte solution can also be reduced down to 8 to 10 percent by weight of $H_2SO_4$ (about 100 g of $H_2SO_4/l$) or also increased to 30 percent by weight (365 g of $H_2SO_4/l$) and more.

The "hard anodizing" is carried out with an aqueous, $H_2SO_4$-containing electrolyte containing 166 g of $H_2SO_4/l$ (or about 230 g of $H_2SO_4/l$) at an operating temperature of 0° to 5° C., and at a current density of 2 to 3 $A/dm^2$, with an increasing voltage of about 25 to 30 V at the start and about 40 to 100 V towards the end of the treatment and for a period from 30 to 200 minutes.

In addition to the processes mentioned in the preceding section, the following processes can also be used for the anodic oxidation of printing plate support materials: for example, anodic oxidation of aluminum in an aqueous $H_2SO_4$-containing electrolyte, the $Al^{3+}$ ion content of which is adjusted to values of more than 12 g/l according to U.S. Pat. No. 4,211,619; anodic oxidation of aluminum in an aqueous $H_2SO_4$- and $H_3PO_4$-containing electrolyte according to U.S. Pat. No. 4,049,504; or anodic oxidation of aluminum in an aqueous, $H_2SO_4^-$, $H_3PO_4^-$ and $Al^{3+}$ ion-containing electrolyte according to U.S. Pat. No. 4,229,226. Direct current is preferably used for the anodic oxidation, but alternating current or a combination of these types of current (for example direct current with superimposed alternating current) can also be used. The weight of the aluminum oxide layer may vary within a range from 1 to 10 $g/m^2$, which corresponds to a layer thickness of about 0.3 to 3.0 $\mu$m.

The anodic oxidation stage in the treatment of the aluminum printing plate support material may also be followed by one or more aftertreatment stages. As used herein, aftertreating means particularly a hydrophilicity-imparting chemical or electrochemical treatment of the aluminum oxide layer, for example a dipping treatment of the material in aqueous polyvinylphosphonic acid solution according to British Pat. No. 1,230,447, a dipping treatment in an aqueous alkali metal silicate solution according to U.S. Pat. No. 3,181,461; or an anodizing electrochemical treatment in an aqueous alkali metal silicate solution according to U.S. Pat. No. 3,902,976. These aftertreatment stages serve in particular to additionally increase the hydrophilicity of the aluminum oxide layer, which is already adequate for many fields of application; the remaining known properties of this layer being at least maintained.

Any layer which, after exposure, optionally with subsequent developing and/or fixing, provides an imagewise area which can be used for printing and/or which represents a relief image of an original can in principle be used as a light-sensitive reproduction layer. Such reproduction layers are applied to one of the customary support materials either directly by the user or by a manufacturer of pre-sensitized printing plates or of so-called dry resists. Suitable light-sensitive reproduction layers include those described, for example, in "Light-Sensitive Systems" by Jaromir Kosar, published by John Wiley & Sons, New York 1965: layers containing unsaturated compounds which are isomerized, rearranged, cyclized, or cross-linked during exposure (Kosar, Chapter 4); layers containing photopolymerizable compounds in which monomers or prepolymers polymerize on exposure, if appropriate by means of an initiator (Kosar, Chapter 5); and layers containing o-diazoquinones, such as naphthoquinonediazides, p-diazoquinones or diazonium salt condensates (Kosar, Chapter 7). Suitable layers also include electrophotographic layers, i.e. those which contain an inorganic or organic photoconductor. In addition to the light-sensitive substances, the reproduction layers can, of course, also contain other constituents such as, for example, resins, dyestuffs or plasticizers. In particular the following light-sensitive compositions or compounds can be used in the coating of support materials:

Positive-working o-quinonediazide compounds preferably o-naphthoquinonediazide compounds, described, for example, in German Pat. Nos. 854,890; 865,109; 879,203; 894,959; 938,233; 1,109,521; 1,144,705; 1,118,606; 1,120,273 and 1,124,817.

Negative-working condensation products of aromatic diazonium salts and compounds having active carbonyl groups, preferably condensation products of diphenylamine diazonium salts and formaldehyde, described, for example, in German Pat. Nos. 596,731; 1,138,399; 1,138,400; 1,138,401; 1,142,871 and 1,154,123; U.S. Pat. Nos. 2,679,498 and 3,050,502 and British Pat. No. 712,606.

Negative-working co-condensation products of aromatic diazonium compounds, for example according to German Offenlegungsschrift No. 2,024,244, which have at least one unit each of the general types $A(-D)_n$ and B linked by a bifunctional linking member derived from a condensable carbonyl compound. In these formulas, the symbols are defined as follows: A is the radical of a compound which contains at least two aromatic carbocyclic and/or heterocyclic nuclei and which, in an acidic medium, is capable of condensing in at least one position with an active carbonyl compound. D is a diazonium salt group bonded to an aromatic carbon atom of A; n is an integer from 1 to 10; and B is the radical of a compound which is free of diazonium groups and which, in an acidic medium, is capable of condensing in at least one position of the molecule with an active carbonyl compound.

Positive-working layers according to German Offenlegungsschrift No. 2,610,842, which contain a compound which splits off acid on irradiation, a compound which has at least one C—O—C group which can be split off by acid (for example, an orthocarboxylate group or a carboxamide acetal group) and, optionally, a binder.

Negative-working layers of photopolymerizable monomers, photoinitiators, binders and, optionally further additives. Examples of monomers used in layers of this type include acrylates and methacrylates or reaction products of diisocyanates with partial esters of polyhydric alcohols, as described, for example, in U.S. Pat. Nos. 2,760,863 and 3,060,023 and German Offenlegungsschriften Nos. 2,064,079 and 2,361,041. Suitable photoinitiators include benzoin, benzoin ether, polynuclear quinones, acridine derivatives, phenazine derivatives, quinoxaline derivatives, quinazoline derivatives or synergistic mixtures of various ketones. Examples of the large number of soluble organic polymers which can be used as binders include polyamides, polyesters, alkyd resins, polyvinyl alcohol, polyvinylpyrrolidone, polyethylene oxide, gelatins and cellulose ethers.

Negative-working layers in accordance with German Offenlegungsschrift No. 3,036,077, which contain, as light-sensitive compound, a diazonium salt polycondensation product or an organic azido compound and, as binder, a high molecular weight polymer having alkenylsulfonyl or cycloalkenylsulfonyl urethane side groups.

It is also possible to utilize photosemiconducting layers, as described, for example, in German Pat. Nos. 1,117,391; 1,522,497; 1,572,312; 2,322,046 and 2,322,047, applied to support-materials, whereby highly light-sensitive, electrophotographic layers are produced.

Further details of the invention will be apparent from a consideration of the following, non-limiting examples. Parts and Percentages are by weight unless otherwise indicated. Parts by weight are related to parts by volume as grams are related to cubic centimeters. The reproduction layers to be developed are on conductive supports and are connected as the cathode in a direct current circuit unless otherwise indicated. The temperature of the electrolyte is 25° to 30° C. unless otherwise indicated and the distance of the copying material to be developed, from the counter-electrode, is as a rule 2.75 cm. As a rule, the course of the current density can be described as follows (see also Example 67): the current density first increases for a few seconds to a certain value, remains for a few seconds at this level and can then again increase slightly towards the end of the electrolytic development. The developing time is, unless otherwise indicated, about 3 to 15 seconds. Unless specific remarks are given, the developed or decoated copying materials conform to customary practice.

EXAMPLE 1

The following positive-working light-sensitive solution is applied to an electrochemically roughened and anodically oxidized aluminum foil by flow-coating using a slot die:

6.6 parts cresol-formaldehyde novolak (with a softening range of 105°–120° C. according to DIN 53,181)

1.1 parts 4-(2-phenylprop-2-yl)phenyl ester of 1,2-naphthoquinone-2-diazide-4-sulfonic acid 0.6 part 2,2'-bis-[1,2-naphthoquinone-2-diazide-5-sulfonyloxy]-1,1'-dinaphthylmethane 0.24 part 1,2-naphthoquinone-2-diazide-4-sulfonyl chloride 0.08 part crystal violet 91.36 parts of a mixture of 4 parts by volume of ethylene glycol monomethyl ether, 5 parts by volume of tetrahydrofuran and 1 part by volume of butyl acetate The resulting plate is exposed imagewise and then electrochemically developed in an aqueous solution containing 3 percent lithium sulfate and 1 percent sodium octyl-sulfate (the sodium salt of the sulfuric acid monooctyl ester) at a pH of 3.5 for 11 to 14 seconds at 20 V.

EXAMPLE 2

An aluminum foil, mechanically roughened with steel brushes, is coated with the following solution and then dried in a drying duct at temperatures up to 100° C.:

1.15 parts esterification product of 1 mole 2,3,4-trihydroxybenzophenone and 2 moles 1,2-naphthoquinone-2-diazide-5-sulfonyl chloride 7.15 parts phenol-formaldehyde novolak (having 14 percent of phenolic OH groups and a softening rahge of 110°–120° C. according to DIN 53,181)

0.64 part 2,2′-bis-[1,2-naphthoquinone-2-diazide-5-sulfonyloxy]-1,1′-dinaphthyl methane 0.15 part crystal violet 0.08 part Sudan Yellow GGN (C.I. 11,021) and 92.25 parts mixture of 40 parts by volume of ethylene glycol monomethyl ether and 50 parts by volume of tetrahydrofuran The resulting plate, after imagewise exposure, is electrochemically developed in an aqueous solution containing 3 percent lithium sulfate and 1 percent sodium octyl-sulfate at a pH of 7.5 for 1 to 3 seconds at 60 V.

EXAMPLE 3 and COMPARATIVE EXAMPLE C 1

A negative-working light-sensitive solution comprising:

14 parts copolymer of methyl methacrylate and methacrylic acid and having a mean molecular weight of 40,000 and an acid number of 90 to 115

14 parts 1,1,1-trimethylolethane triacrylate 2 parts 1,6-dihydroxyethoxyhexane, 0.50 part 9-p-hydroxyphenylacridine and 130 parts ethylene glycol monoethyl ether is applied to an electrochemically roughened and anodically oxidized aluminum foil rendered hydrophilic with an aqueous solution of polyvinylphosphonic acid. After imagewise exposure, the layer is electrochemically developed in an aqueous solution containing 3 percent lithium sulfate and 1 percent sodium octylsulfate at a pH of 3.5 for 5 to 10 seconds at 10 V. The quality of the resulting printing plate can be compared with that obtained after non-electrochemical developing in 15 parts sodium metasilicate . 9H$_2$O, 3 parts polyethylene glycol having a mean molecular weight of about 6,000

0.6 part levulinic acid 0.3 part strontium hydroxide . 8H$_2$O, and 1,000 parts water, except that the developing time in the Comparative Example was about 60 seconds.

EXAMPLE 4

A layer of the following negative-working light-sensitive mixture is applied to an electrochemically roughened and anodically oxidized aluminum foil which has been rendered hydrophilic with an aqueous solution of polyvinylphosphonic acid:

26.75 parts 8 percent solution of the reaction product of a polyvinylbutyral (having a molecular weight of 70,000 to 80,000 and comprising 71 percent vinylbutyral, 2 percent vinyl acetate and 27 percent vinyl alcohol units) with propenylsulfonyl isocyanate 2.14 parts 2,6-bis-(4-azidobenzene)-4-methylcyclohexanone 0.23 part Rhodamin 6 GDN extra 0.21 part 2-benzoylmethylene-1-methyl-$\beta$-naphthothiazine 100 parts by volume ethylene glycol monomethyl ether, and 50 parts by volume tetrahydrofuran Electrochemical developing takes place in an aqueous solution containing 1.5 percent lithium carbonate and 1 percent sodium octyl-sulfate at a pH of 8 for 10 to 12 seconds at 60 V. After wiping clean, a printing plate adequate for practical use is obtained.

EXAMPLE 5

An electrophotographic layer comprising:

10 parts 2-vinyl-5-(4′-diethylaminophenyl)-4-(2′-chlorophenyl)-oxazole 10 parts copolymer of styrene and maleic anhydride (having a softening point of 210° C.)

0.02 part Rhodamin FB (C.I. 45,170), and 300 parts ethylene glycol monomethyl ether is applied to an electrochemically roughened and anodically oxidized aluminum foil which has been rendered hydrophilic with an aqueous solution of polyvinylphosphonic acid. This layer is negatively charged with a Corona in the dark to about 400 volts. The charged plate is exposed in a reprographic camera and then toner is applied and fixed by methods customary in electrophotography. The plate can then be electrochemically decoated in the non-image areas in a 1.5 percent aqueous lithium carbonate solution containing 1 percent sodium octyl-sulfate for 8 to 12 seconds at 60 V and a pH of 8 and a temperature of 50° C. after a preceding non-electrolytic residence time in the solution of 30 seconds.

EXAMPLE 6

The electrophotographic layer of Example 5 is applied to an aluminum support, mechanically roughened by dry brushing, and processed according to the procedure of Example 5. The decoating takes place in the same electrolyte under identical conditions, but without a preceding non-electrochemical treatment phase.

EXAMPLE 7

An electrochemically roughened and anodically oxidized aluminum support, which has been rendered hydrophilic with an aqueous solution of polyvinylphosphonic acid, is coated with the following negative-working light-sensitive solution:

1 part polycondensation product of 1 mole 3-methoxydiphenylamine-4-diazonium sulfate and 1 mole 4,4′-bis-methoxymethyldiphenyl ether, precipitated as the salt of mesitylenesulfonic acid 1.8 parts non-plasticized urea resin (having a viscosity in 65 percent strength solution in butanol/xylene at 20° C. of about 6,000 mPa.s and an acid number below 3)

0.4 part crystal violet, and 98 parts ethylene glycol monomethyl ether.

Electrochemical developing takes place in an aqueous solution containing 3 percent sodium phosphate and 3 percent ethoxylated isotridecyl alcohol containing 8 ethylene oxide units at a pH of 7 (pH value set with H$_3$PO$_4$) for 5 to 7 seconds at 20 V. The plate is developed in accord with the image to which it was exposed, however the full tone areas are slightly attacked.

EXAMPLE 8

A positive-working light-sensitive solution comprising:

25 parts bis-(5-ethyl-5-butyl-1,3-dioxan-2-yl) ether of 2-ethyl-2-butyl-1,3-propanediol 71 parts cresol-formaldehyde novolak
0.7 part crystal violet base
3 parts 2-(acenaphth-5-yl)-4,6-bis-trichloromethyl-s-triazine, and
900 parts ethylene glycol monomethyl ether is applied to an electrochemically roughened and anodically oxidized aluminum foil. After exposure, the foil can be electrochemically developed in an aqueous solution containing 3 percent lithium sulfate and 1 percent sodium octylsulfate at a pH of 3.5 using a potential of 15 to 20 V.

EXAMPLE 9

The plate of Example 3 is electrochemically developed in a 6 percent aqueous sodium lauryl-sulfate solution at a pH of 4.

EXAMPLE 10

An aluminum foil, mechanically roughened by dry brushing and anodically oxidized, is coated with a positive-working light-sensitive solution comprising:

1.6 parts esterification product of 1 mole 2,3,4-trihydroxybenzophenone and 2 moles 1,2-naphthoquinone-2-diazide-5-sulfonyl chloride
0.9 part 2,2'-bis-[1,2-naphthoquinone-2-diazide-5-sulfonyloxy]-1,1'-dinaphthylmethane
6.4 parts cresol-formaldehyde novolak (having a softening range of 105°–120° C. according to DIN 53,181
90.1 parts mixture of 4 parts by volume ethylene glycol monomethyl ether, 5 parts by volume tetrahydrofuran and 1 part by volume butyl acetate This coated foil is electrochemically developed in an aqueous solution containing 3 percent ammonium phosphate and 1 percent sodium octyl-sulfate at a pH of 7.5 (set with $H_3PO_4$).

EXAMPLES 11 to 61

One of the copying materials described above is electrochemically developed in the solution indicated in the following table. The developing conditions are also given in the table.

TABLE

| Example | Type of copying material | Aqueous electrolyte Type | Concentration (%) | Surfactant Type | Concentration (%) | pH value | Remarks |
|---|---|---|---|---|---|---|---|
| 11 | light-sensitive layer according to Example 1, support additionally rendered hydrophilic with an aqueous solution of polyvinylphosphonic acid | Na thiosulfate | 3 | Na octylsulfate | 1 | 3.5 | |
| 12 | see Example 6 | Na sulfate | 3 | Na octylsulfate | 1 | 2.5 | Temperature 40° C. |
| 13 | see Example 5 | $NH_4$ phosphate | 3 | ethoxylated isotridecyl alcohol containing 8 ethylene oxide units | 3 | 8 | Temperature 45° C. |
| 14 | see Example 3 | Li sulfate | 3 | stearylammonium chloride/ethylene oxide adduct containing 5 ethylene oxide units | 0.6 | 4 | — |
| 15 | see Example 2 | Al sulfate | 3 | Na octylsulfate | 1 | 8 | — |
| 16 | see Example 1 | Na sulfate | 3 | Na octylsulfate | 1 | 2.5 | — |
| 17 | see Example 3 | Na sulfate | 3 | Na octylsulfate | 1 | 2.5 | — |
| 18 | see Example 6 | Na phosphate | 3 | — | — | 3–4 | Temperature 45° C. to 55° C., pH value set with $H_3PO_4$ |
| 19 | see Example 2 | Na nitrate | 3 | Na octylsulfate | 1 | 3 | — |
| 20 | see Example 11 | Na nitrate | 3 | Na octylsulfate | 1 | 2.5 | — |
| 21 | see Example 3 | Na bromide | 3 | Na octylsulfate | 1 | 6 | — |
| 22 | see Example 2 | Na phosphate | 3 | — | — | 7 | pH value set with $H_3PO_4$ |
| 23 | light-sensitive layer according to Example 1, support of chromed iron | Na hydrocarbonate | 3 | ethoxylated tridecyl alcohol containing 8 ethylene oxide units | 3 | 4 | — |
| 24 | see Example 3 | Na nitrate | 3 | Na octylsulfate | 1 | 3 | — |
| 25 | see Example 2 | Na bromide | 3 | Na octylsulfate | 1 | 3 | — |
| 26 | see Example 23 | Na phosphate | 3 | ethoxylated isotridecyl alcohol con- | 3 | 8 | — |

TABLE-continued

| Example | Type of copying material | Aqueous electrolyte Type | Concentration (%) | Surfactant Type | Concentration (%) | pH value | Remarks |
|---|---|---|---|---|---|---|---|
| 27 | see Example 3 | Li sulfate | 3 | taining 8 ethylene oxide units Na salt of the sulfuric acid mono(7-ethyl-2-methylundec-4-yl) ester | 1 | 4 | — |
| 28 | see Example 2 | Na chloride | 3 | Na octylsulfate | 1 | 6 | — |
| 29 | see Example 11 | Li sulfate | 3 | Na octylsulfate | 1 | 3.5 | — |
| 30 | see Example 3 | Na chloride | 3 | Na octylsulfate | 1 | 6 | — |
| 31 | see Example 2 | Na vanadate | 3 | Na octylsulfate | 1 | 9.5 | — |
| 32 | see Example 11 | Li sulfate | 3 | Na salt of the sulfuric acid mono(7-ethyl-2-methylundec-4-yl) ester | 1 | 4 | — |
| 33 | see Example 5 | Na chloride | 3 | Na octylsulfate | 1 | 4 | oxide layer slightly attacked |
| 34 | see Example 2 | Na laurylsulfate | 6 | — | — | 4 | — |
| 35 | see Example 11 | Na nitrate | 3 | Na octylsulfate | 1 | 4 | — |
| 36 | see Example 3 | " | 3 | ethoxylated isotridecyl alcohol containing 8 ethylene oxide units | 3 | 4 | — |
| 37 | see Example 2 | Li sulfate | 3 | stearylammonium chloride/ ethylene oxide adduct containing 5 ethylene oxide units | 0.6 | 7 | — |
| 38 | see Example 2 | NH₄ phosphate | 3 | Na decylsulfate | 1 | 9 | — |
| 39 | see Example 23 | Na nitrate | 3 | ethoxylated isotridecyl alcohol containing 8 ethylene oxide units | 3 | 4 | — |
| 40 | see Example 3 | Na phosphate | 3 | ethoxylated isotridecyl alcohol containing 8 ethylene oxide units | 3 | 7–8 | pH value set with H₃PO₄ |
| 41 | see Example 2 | Na phosphate | 3 | Na octylsulfate | 1 | 7 | pH value set with H₃PO₄ |
| 42 | see Example 3 | NH₄ sulfate | 3 | Na octylsulfate | 1 | 3 | — |
| 43 | see Example 2 | Mg sulfate | 3 | Na octylsulfate | 1 | 6 | — |
| 44 | see Example 2 | " | 3 | Na octylsulfate | 1 | 2.5 | pH value set with H₂SO₄ |
| 45 | see Example 2 | Na hydrogen carbonate | 3 | ethoxylated isotridecyl alcohol containing 8 ethylene oxide units | 3 | 8 | — |
| 46 | see Example 2 | Na acetate | 3 | ethoxylated isotridecyl alcohol containing 8 ethylene oxide units | 3 | 4.5 | — |
| 47 | see Example 1 | Li sulfate | 3 | stearylammonium chloride/ ethylene oxide adduct containing 5 ethylene oxide units | 0.6 | 5 | — |

TABLE-continued

| Example | Type of copying material | Aqueous electrolyte Type | Concentration (%) | Surfactant Type | Concentration (%) | pH value | Remarks |
|---|---|---|---|---|---|---|---|
| 48 | see Example 2 | Na hydrogen carbonate | 3 | ethoxylated isotridecyl alcohol containing 8 ethylene oxide units | 3 | 4 | — |
| 49 | light-sensitive layer according to Example 1, support mechanically roughened with brushes and abradants | Na chloride | 3 | ethoxylated isotridecyl alcohol containing 8 ethylene oxide units | 3 | 6 | — |
| 50 | see Example 2 | Na borate | 3 | ethoxylated isotridecyl alcohol containing 8 ethylene oxide units | 3 | 3.5 | — |
| 51 | see Example 49 | Na nitrate | 3 | ethoxylated isotridecyl alcohol containing 8 ethylene oxide units | 3 | 4 | — |
| 52 | see Example 2 | Na phosphate | 3 | ethoxylated isotridecyl alcohol containing 8 ethylene oxide units | 3 | 7 | pH value set with $H_3PO_4$, alternating current 40 V/50 Hz |
| 53 | see Example 2 | Li sulfate | 3 | Na octyl-sulfate | 1 | 3 | alternating current 40 V/50 Hz |
| 54 | see Example 3 | " | 3 | Na octyl-sulfate | 1 | 3 | alternating current 40 V/50 Hz |
| 55 | see Example 2 | " | 3 | Na octyl-sulfate | 1 | 3 | alternating current 0.5 Hz |
| 56 | see Example 2 | " | 3 | Na octyl-sulfate | 1 | 3 | alternating current 5 Hz |
| 57 | see Example 2 | " | 3 | Na octyl-sulfate | 1 | 3 | alternating current 500 Hz |
| 58 | see Example 2 | $NH_4$ phosphate | 3 | Na octyl-sulfate | 1 | 7.5 | — |
| 59 | see Example 3 | tetraethylammonium hydroxide | 3 | ethoxylated isotridecyl alcohol containing 8 ethylene oxide units | 3 | 3 | pH value set with $H_3PO_4$ |
| 60 | see Example 3 | boric acid | 3 | Na octyl-sulfate | 1 | 2.5 | Temperature 50° C. |
| 61 | see Example 3 | acetic acid | 3 | Na octyl-sulfate | 1 | 2.5 | Temperature 50° C. |

EXAMPLE 62

An electrochemically roughened and anodically oxidized aluminum foil which has been rendered hydrophilic with an aqueous solution of polyvinylphosphonic acid is coated with the following negative-working light-sensitive solution:
2 parts a styrene/maleic anhydride copolymer (1:1, molecular weight 50,000) which has been reacted with hydroxyethyl methacrylate 2 parts diurethane reaction product of 2 moles glycerol dimethylacrylate and 1 mole hexamethylene diisocyanate
0.70 part 9-phenylacridine
0.07 part Samaron Navy
32 parts butanone
12 parts butyl acetate, and
12 parts ethylene glycol monomethyl ether.
After exposure, the electrochemical developing takes place in an aqueous solution containing 3 percent ammonium sulfate and 1 percent sodium octyl-sulfate at a pH of 4 for 4 to 6 seconds at 40 V.

EXAMPLE 63

The plate of Example 62 is electrochemically developed in an aqueous solution containing 3 percent sodium nitrate and 3 percent ethoxylated isotridecyl alcohol having 8 ethylene oxide units at a pH of 4.

EXAMPLE 64

An electrochemically roughened and anodically oxidized aluminum foil is coated with an electrophotographic solution comprising:
10 parts 2,5-bis-(4'-diethylaminophenyl)-1,3,4-oxadiazole
10 parts copolymer of styrene and maleic anhydride (having a softening point of 210° C.)
0.02 part Rhodamin FB (C.I. 45,170), and
300 parts ethylene glycol monomethyl ether.

The coated plate is negatively charged with a Corona to about 400 V and exposed through a film original. The resulting electrostatic image is made visible by dusting with resin colored by carbon black and fixed by heating to 150° C. to give a smudgeproof electrocopy. The layer is removed electrochemically from the non-image areas in an aqueous solution containing 3 percent ammonium phosphate and 3 percent of an ethoxylated isotridecyl alcohol with 8 ethylene oxide units at a pH of 8.

EXAMPLE 65

A chromed copper foil is coated with the following negative-working, light-sensitive solution:
0.25 part polyvinyl acetate (Höppler viscosity of 2,200 mPa.s in a 20 percent ethyl acetate solution at 20° C.)
0.75 part polyvinyl acetate (40 mPa.s)
4 parts phenol-formaldehyde novolak (softening range 110° to 120° C. according to DIN 53,181)
1 part condensation product of cyclohexanone and formaldehyde (softening range 75° to 90° C.)
3 parts 4-(2-phenylprop-2-yl)-phenyl ester of 1,2-naphthoquinone-2-diazide-4-sulfonic acid
0.20 part crystal violet
88.8 parts ethylene glycol, and
2 parts distilled $H_2O$ After exposure the exposed layer is electrochemically developed in an aqueous solution containing 3 percent lithium sulfate and 1 percent sodium octyl-sulfate at a pH of 3.

EXAMPLE 66

A dry-brushed aluminum foil is provided with a liquid photoresist layer having the following composition:
4 parts cresol-formaldehyde novolak (melting range 105°–120° C. according to DIN 53,181)
1 part bis-1,2-naphthoquinonediazide-5-sulfonic acid ester of 2-ethoxyethyl 4,4′-bishydroxyphenylvalerate, and
40 parts methyl ethyl ketone After imagewise exposure, electrochemical developing takes place in an aqueous solution containing 3 percent lithium sulfate and 1 percent sodium octylsulfate at a pH of 3.

EXAMPLE 67

The plate of Example 3 is electrochemically developed at a voltage of 30 V (direct current) for 10 seconds in an aqueous solution containing 3 percent lithium sulfate and 1 percent sodium octyl-sulfate at a pH of 3. The current density increases at the start for the first 5 seconds to about 25 $A/dm^2$, then remains for 3 seconds at this value and again slightly increases in the final two seconds.

EXAMPLE 68

The plate of Example 3 is developed using a cellulose hydrate sponge cloth soaked with an aqueous solution containing 3 percent lithium sulfate and 1 percent sodium octyl-sulfate, as an electrolyte reservoir. The soaked sponge cloth is thereby arranged between a graphite electrode and the plate to be developed. Development of the plate is carried out for 3 to 6 seconds, at a pH of 3 and a voltage of 15 V.

The foregoing description has been set forth merely to illustrate the invention and is not intended to be limiting. Since modifications of the described embodiments incorporating the spirit and substance of the invention may occur to persons skilled in the art, the scope of the invention is to be limited solely with respect to the appended claims and equivalents.

I claim:

1. A process for developing exposed light-sensitive reproduction layers using an aqueous electrolyte developer; said process comprising removing by electrochemical treatment those parts of the exposed layer which correspond to the non-image areas, wherein said aqueous electrolyte developer comprises at least one salt of an organic or inorganic acid and/or at least one weak acid or base.

2. A process according to claim 1, wherein the pH of the aqueous electrolyte lies in the range from 2.0 to 10.00.

3. A process according to claim 2, wherein said aqueous developer contains a buffer system to maintain the pH of the developer at a desired value.

4. A process according to claim 1, wherein the aqueous electrolyte contains a surfactant in a concentration from 0.1 to 5 weight percent.

5. A process according to claim 1, wherein the electrochemical treatment is carried out at a current density from 1 to 100 $A/dm^2$ and at a temperature from 20° to 70° C.

6. A process according to claim 5, wherein the electrochemical treatment is carried out with direct current.

7. A process according to claim 5, wherein the electrochemical treatment is carried out with alternating current.

8. A process according to claim 1, wherein the reproduction layer to be developed is provided with an electrically conductive support material.

9. A process according to claim 8, wherein the reproduction layer to be developed is the light-sensitive layer of an offset printing plate.

10. A process according to claim 8, wherein the reproduction layer to be developed is a photoresist applied to a support material.

11. A process according to claim 1, wherein said aqueous developer contains corrosion inhibiting means for preventing attack by the developer on a support on which the light-sensitive reproduction layer is deposited.

12. A process according to claim 1, wherein an aqueous electrolyte impregnated cloth is positioned as an electrolyte reservoir between the exposed reproduction layer and a counterelectrode during the electrochemical treatment.

13. A process as defined in claim 1, wherein said removing step comprises dissolving said non-image areas.

14. A process as defined in claim 1, wherein said removing step is performed in about 0.5 to 30 seconds.

15. A process for developing exposed light-sensitive reproduction layers, comprising the steps of:
providing an exposed light-sensitive reproduction layer on an electrically conductive support material; and
removing by electrochemical treatment with an aqueous electrolyte developer those parts of the exposed layer which correspond to the non-image areas, wherein said aqueous electrolyte developer comprises at least one salt of an organic or inorganic acid and/or at least one weak acid or base.

16. A process as defined in claim 15, wherein said removing step comprises dissolving said non-image areas.

17. A process for developing exposed light-sensitive reproduction layers on printing plates, comprising the steps of:

provinding an exposed light-sensitive reproduction layer comprising, as the light-sensitive component, a composition or compound selected from the group consisting of o-quinonediazides, condensation and co-condensation products of aromatic diazonium salts and compounds, compounds which split off acid on irradiation, photopolymerizable monomers and photoinitiators, organic azido compounds and photo-semiconducting compounds on an electrically conductive support material comprising aluminum or an aluminum alloy; and removing, by electrochemical treatment with an aqueous electrolyte developer, those parts of the exposed layer which correspond to the non-image areas, wherein said electrolyte developer comprises at least one salt of an organic or inorganic acid and/or at least one weak acid or base.

18. A process as defined in claim 17, wherein said removing step comprises dissolving said non-image areas.

19. A process for developing exposed light-sensitive reproduction layers using an aqueous electrolyte developer; said process comprising removing by electrochemical treatment those parts of the exposed layer which correspond to the non-image areas, wherein said aqueous electrolyte developer comprises at least one salt of an organic or inorganic acid in a concentration from 0.1 weight percent up to the saturation limit of the solution for said salt.

20. A process according to claim 19, wherein the concentration of said salt lies in the range from 1 to 5 weight percent.

* * * * *